(12) United States Patent
Reitman

(10) Patent No.: US 6,420,194 B1
(45) Date of Patent: Jul. 16, 2002

(54) METHOD FOR EXTRACTING PROCESS DETERMINANT CONDITIONS FROM A PLURALITY OF PROCESS SIGNALS

(75) Inventor: Edward Alois Reitman, Gotha, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/616,120

(22) Filed: Jul. 14, 2000

Related U.S. Application Data

(63) Continuation-in-part of application No. 09/416,642, filed on Oct. 12, 1999.

(51) Int. Cl.$^7$ .............................................. H01L 21/00
(52) U.S. Cl. ........................... 438/9; 156/345; 216/60; 216/67; 438/16; 438/710
(58) Field of Search ............................ 216/60, 67, 85, 216/84; 438/9, 14, 16, 710; 156/345 MT

(56) References Cited

U.S. PATENT DOCUMENTS

| | | |
|---|---|---|
| 4,263,088 A | 4/1981 | Gorin |
| 4,616,318 A | 10/1986 | Crawford |
| 5,121,469 A | 6/1992 | Richards et al. |
| 5,160,402 A | 11/1992 | Cheng |
| 5,288,367 A | 2/1994 | Angell et al. |
| 5,658,423 A | 8/1997 | Angell et al. |
| 5,711,843 A | 1/1998 | Jahns |
| 6,021,215 A | 2/2000 | Kornblit et al. |

OTHER PUBLICATIONS

Edward A. Reitman, Nace Layadi, Dynamic images of plasma parocesses: Use of Fourier blobs for endpoint detection during plasma etching of patterned wafers, J. Vac. Sci. Technol. A 16(3) May/Jun. 1998 pp. 1449–1453.

Primary Examiner—William A. Powell
(74) Attorney, Agent, or Firm—Holland & Knight LLP

(57) ABSTRACT

A system and method for identifying events in a manufacturing process from a sequence of m-dimensional input data signals, $m \geq 2$ obtained from monitoring of the manufacturing process utilizing a data processor for transforming each m-dimensional input data signal to a set of output data signals based on an orthogonal polynomial transform function, wherein the input data signals are used as coefficients in evaluating the polynomial transform functions. The data processor also integrates the transform function within the defined limits of the transform function to determine a scalar value as a function of time. A display system may be used to display a graph of the scalar values as a function of time for visually identifying events or the processor may identify events based on detected scalar values. The transform function may be Fourier, Chebyshev, Legendre or other polynomial type function.

28 Claims, 18 Drawing Sheets

NORMALIZED APPLIED rf POWER
PLOTTED AS A "CLOCK" REFERENCE

ENDPOINT
SIGNAL

INTEGRATED FOURIER
BLOB ENDPOINT

METHOD FOR EXTRACTING PROCESS DETERMINANT CONDITIONS FROM A PLURALITY OF PROCESS SIGNALS

SPECIFIC DATA RELATED TO INVENTION

This application is a continuation-in-part of U.S. Ser. No. 09/416,642, filed Oct. 12, 1999.

FIELD OF THE INVENTION

This invention relates to the field of processing multiple data signals to identify specific conditions in a process and, more particularly, the present invention relates to determining endpoints in plasma etch processing of semiconductors.

BACKGROUND OF THE INVENTION

Commonly assigned U.S. Pat. No. 6,021,215 describes a data visualization method and system that is used in a manufacturing process, and more particularly, a semiconductor manufacturing process to determine plasma etch conditions. Sequences of sets of input data signals reflect the state of an observed process as state variables in a plasma etch process. Each set of input data signals is transformed using a Fourier-like transform and represented in polar coordinate form such that a visual display of the transformed set of signals appears as a "blob". The sequence of sets of output data signals can then be displayed as a sequence of blobs. Based upon visually observable changes in the blob characteristics, the endpoints in the process can be determined. Thus, by observing changes in blob shapes, it is possible to visually determine that an endpoint to an etch process has occurred. However, it is not always desirable to use data visualization and blob analysis.

SUMMARY OF THE INVENTION

Among the several objects and features of the present invention may be noted the representation of many channels of information from currently available in-situ process signals in a single parameter in order to detect subtle changes indicating an endpoint to a process.

In accordance with the present invention, the method processes a sequence of sets of input data signals, each set of input data signals comprising $m \geq 2$ data signals. Each set of input data signals is transformed to a set of output data signals based on an orthogonal polynomial transform function to generate a sequence of sets of output signals. The data signals are used as coefficients in evaluating the polynomial transform function. The transformed signals are integrated, based on the polynomial expansion, to determine an area as a function of time.

In still another aspect of the present invention, the method comprises the step of integrating between upper and lower limits. Each set of input data signals can reflect the state of an observed process. The sets of input data signals comprise data signals $I_1, I_2, \ldots I_m$, which reflect real time observations of respective state variables of the observed process. They can also reflect non-real time observation for the process.

In another aspect of the present invention, the state variables can represent intensity values at optical emission spectrum wavelengths that are monitored in the plasma etching process. They can also represent radio frequency power and DC bias. In another aspect of the present invention, the state variables represent process temperatures during the plasma etch process.

A system for processing a sequence of m-dimensional input data signals, with $m \leq 2$, comprises a data processor for transforming each m-dimensional input data signal to an output transform signal based on an orthogonal polynomial transform function. These transform signals can be converted to a polar coordinate form to form respective blob signals for visual analysis as described in U.S. Pat. No. 6,021,215. However, it may be preferable to perform integration on the orthogonal transform function to obtain a set of scalar values that can be used to detect process endpoints by detection of amplitude changes.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE INVENTION

Figure 1:
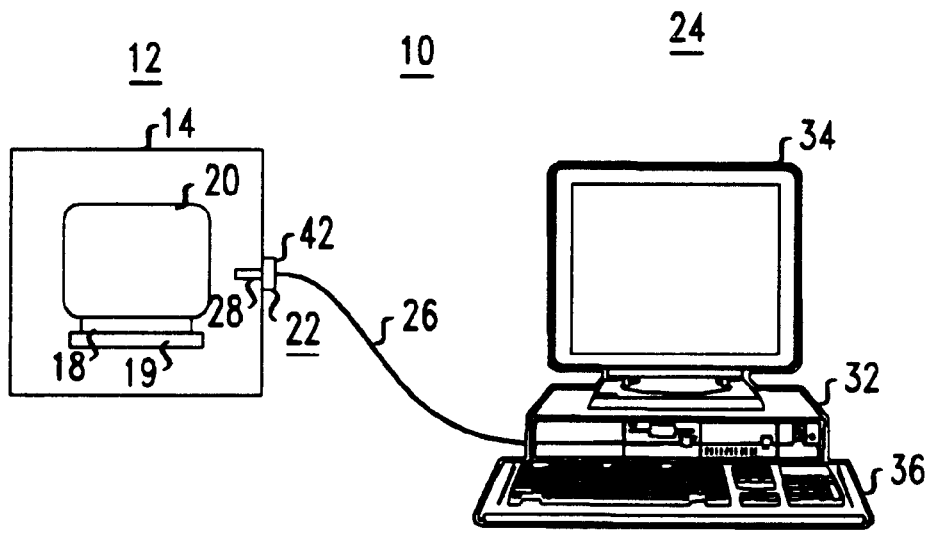
FIG. 1 is an overall view of a system embodiment for monitoring and controlling a plasma etching process that can be used in the present invention.

For purposes of clarity and understanding, a brief description of the process used in U.S. Pat. No. 6,021,215 (the '215 patent) is set forth, followed by a more detailed description of the present invention. FIG. 1, taken from the '215 patent, shows an illustrative application where a plasma etch system is monitored to supply optical emission spectral (OES) data to be processed and displayed by a data processor. More particularly, in FIG. 1, an endpoint detection system 10 couples plasma etch system 12 to a data processing system 24 to effect this overall result. Plasma etch system 12 in turn includes a chamber 14 and a cathode 16. A semiconductor wafer 18 is typically supported by the cathode 16, and a plasma discharge 20 is formed over the cathode 16 by applying radio frequency (RF) power to at least the cathode 16. By plasma etch system is meant a system which produces a plasma discharge, including conventional plasma etch systems where both a cathode and an anode are RF powered and reactive ion etch (RIE) systems where only the cathode is provided with RF power. An illustrative plasma reaction chamber 14 is a model 5300 Omega system from applied materials.

The illustrative endpoint detection system 10 in FIG. 1 also includes a sensor assembly 22 coupled to computer system 24 by a cable 26. The sensor assembly 22 has a probe portion 28 which extends into chamber 14 through an aperture in the chamber wall and a housing portion 42 which encloses photo sensors and analog circuitry for the sensor assembly. The digital computer system 24 typically comprises a general purpose digital computer such as a personal computer, workstation or minicomputer made by such well known manufacturers as IBM, Apple, Sun and Hewlett-Packard. The digital computer system 24 typically includes a base unit 32 enclosing the CPU, memory, disk drives and I/O ports, a monitor 34 for visually displaying output from the system and a keyboard 36 for entering commands and data into the system.

Details of illustrative photo sensors and their connection to computer system 24 are well known in the art. One example of such system elements and their interconnection is provided in U.S. Pat. No. 5,160,402 issued to Cheng on Nov. 3, 1992. It will be recognized by those skilled in the art that other particular sensors may be employed and that the techniques described by Cheng for weighting and combining data from the sensors forms no necessary part of the present invention. Rather, as will be detailed below, the data from individual optical sensors or other types of sensors is received by computer system 24 and transformed into a sequence of visual signals for observation by a system operator.

U.S. Pat. No. 4,263,088 issued Apr. 21, 1981 to Gorin further illustrates a plasma etching chamber and monitoring of a plasma etch process for control of the plasma reaction. Specifically, Gorin teaches adjustment of power to the plasma reaction from continuous input to pulsed input when certain emission characteristics are detected.

In an illustrative system of the type shown in FIG. 1, it proves convenient to use a umber, m, of sensors each providing OES data or rf conditions, or matching network conditions or plasma chamber conditions. It will be understood that the sensor outputs are processed by standard amplifiers, filters, and related analog circuitry (not shown in FIG. 1) as may be required to produce output signals indicative of the processing conditions in the plasma environment. These individual output signals are then sampled in standard fashion at discrete time intervals to produce digital representations of the sensor data to data processor 24 over link 26.

Figure 2:
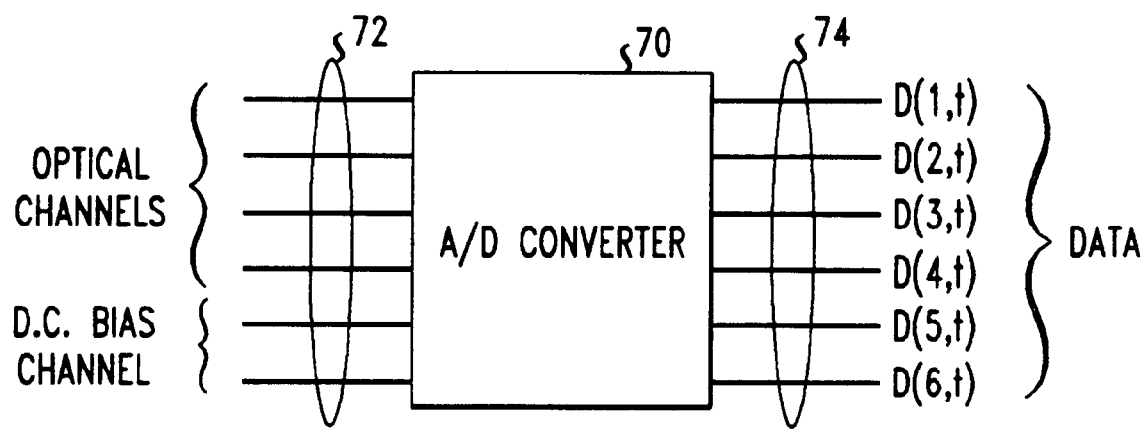
FIG. 2 shows additional circuitry advantageously used to convert sensor signals in the system of FIG. 1 to a form suitable for processing by a computer in that system.

FIG. 2 illustrates apparatus embodying these latter functions in showing outputs 72 from the sensors passing through analog-to-digital converter 70 to produce digital outputs 74 labeled D(i,t), i=1, 2, . . . m, where t assumes increasing values of discrete time, i.e., t=1, 2, 3, . . . n. In one illustrative case, optical emissions may be monitored at five discrete frequencies, i.e., m=5. Illustratively, the five data outputs provide OES data at wavelengths of 251, 288, 309, 727 and 770 nm, though other particular values may prove convenient in other applications. It also proves convenient in some circumstances to include an indication of the value of d.c. bias for the etch system cathode. This can result in an additional data output sequence, shown as D(6,t) in FIG. 2, but this bias data need not be used in the blob processing for the five-frequency etch-monitoring system of the '215 patent. Use of bias data and other system parameters proves useful in process analysis. Accordingly, process parameters including gas flows, pressures and mixes, electrical potentials and power may prove useful and are supplied, as needed, via cable 26 and converter 70 to data processor 24.

It is known that careful timing of an etch process is very important to the quality of the resulting integrated circuit device. When etching through one film until another film is encountered, it is generally desired to end the etch shortly after breakthrough from etching the first film. By monitoring several optical wavelengths in the optical emission of the processing signals in the manner described above, direct pointers to the molecular species and the plasma conditions are obtained. While OES monitoring is described for purposes of the present invention, it will be recognized that other parameters such as acoustic characteristics could be substituted for or combined with OES.

Figure 3:
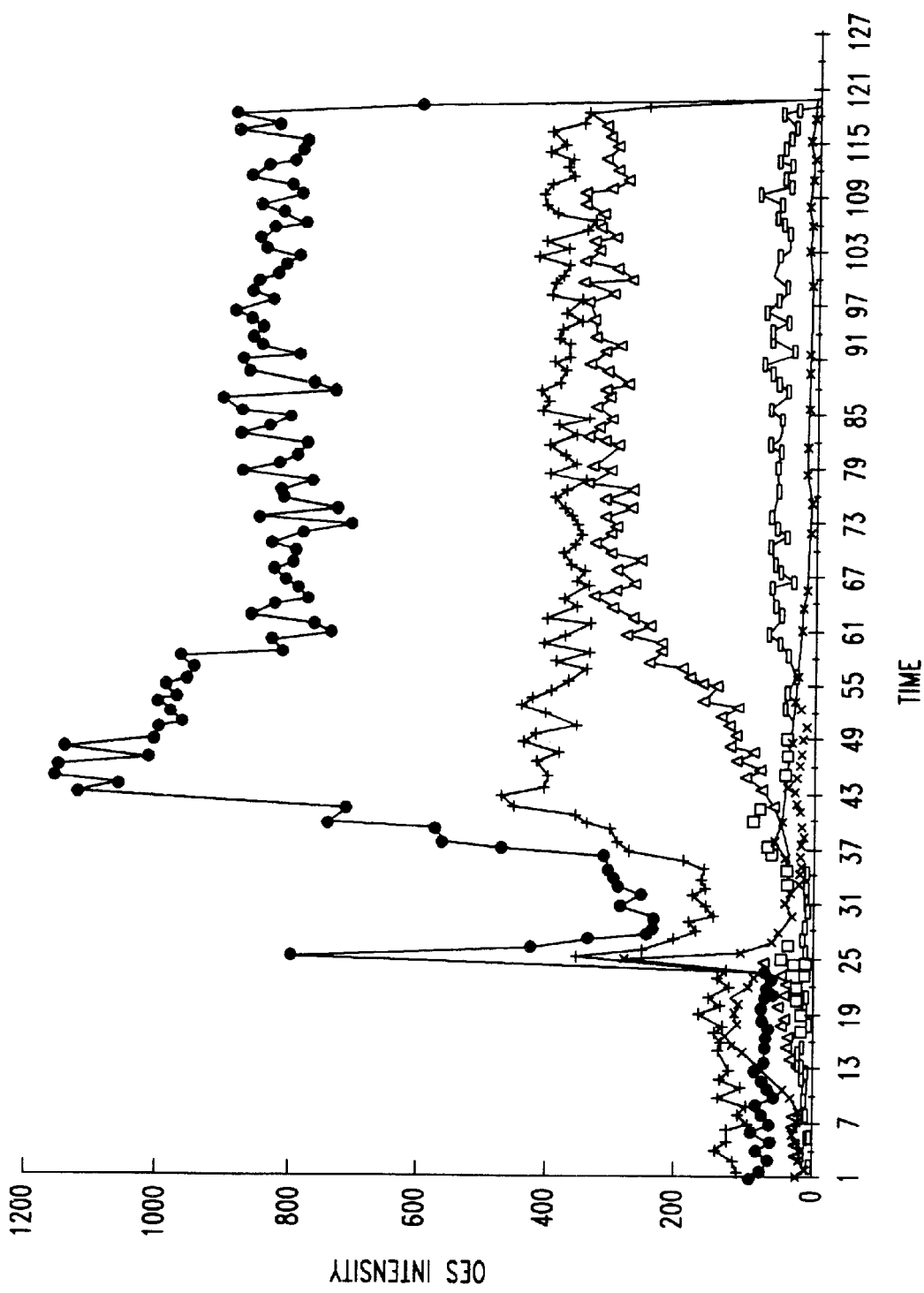
FIG. 3 shows plots for OES data signals for M=5 spectrum lines during a plasma etching operation.

FIG. 3 is a plot of optical emission spectral (OES) lines during an illustrative etching of a refractory material on top of a polysilicon layer, and etching the polysilicon layer to an endpoint on an oxide layer. In this illustration, the number of spectral lines monitored is eight, i.e., m=8. It will be noted that precise identification of the endpoint of the etch is not readily apparent from the OES plot of FIG. 3. Most process points, e.g., breakthrough from the refractory layer to the polysilicon layer and the endpoint for the etch from the polysilicon layer to the oxide layer are identifiable only approximately from the plot of FIG. 3.

Because of the abundance of raw data and the complexity of the underlying monitored process, it proves convenient, in accordance with one aspect of the present invention, to employ data visualization using transformation of the input data to blobs, which, in the '215 patent were Fourier blobs.

If intensity data for each of the m-monitored data signal lines is designated $I_i$, i=1, . . . m, the monitored data takes the form of a set of data points $[I_1, \ldots I_m]$ for each sample time, t. Using a Fourier-like representation for a data set yields, for m=8

$$f(\theta, t) = \frac{I_1}{\sqrt{2}} + I_2\sin\theta + I_3\cos\theta + I_4\sin2\theta + \qquad \text{(Eq. 1)}$$
$$I_5\cos2\theta + I_6\sin3\theta + \ldots$$

These points can be plotted on Cartesian coordinates. A Cartesian coordinate, however, would remove much of the original information some plasma system engineers would recognize as identifying (at least approximately) the process endpoint, and obscure important details that would help system operators to recognize as a process endpoint. A plot of the function f of (Eq. 1) for one time instant would also prove quite difficult to discern meaningful changes in the monitored plasma etching process.

Figure 4:
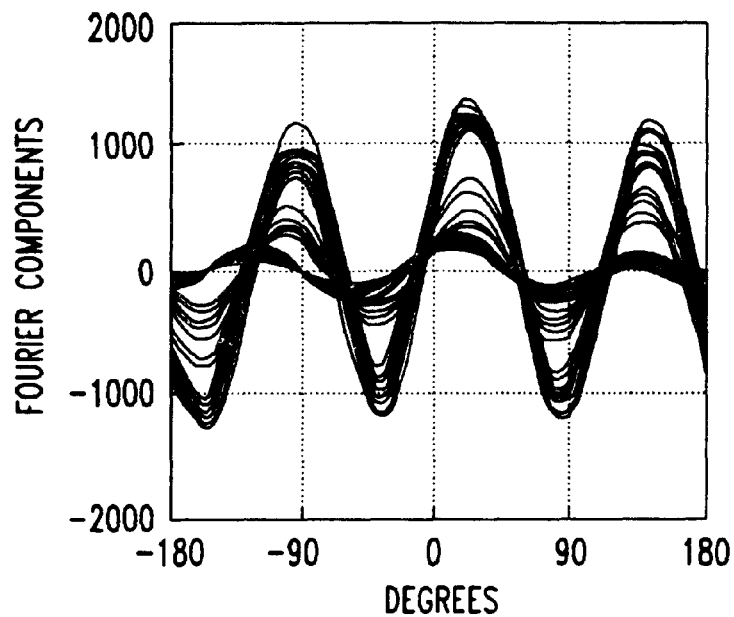
FIG. 4 shows a Cartesian coordinate plot of a time sequence of Fourier-like transform OES spectrum data signals.
Figure 5:
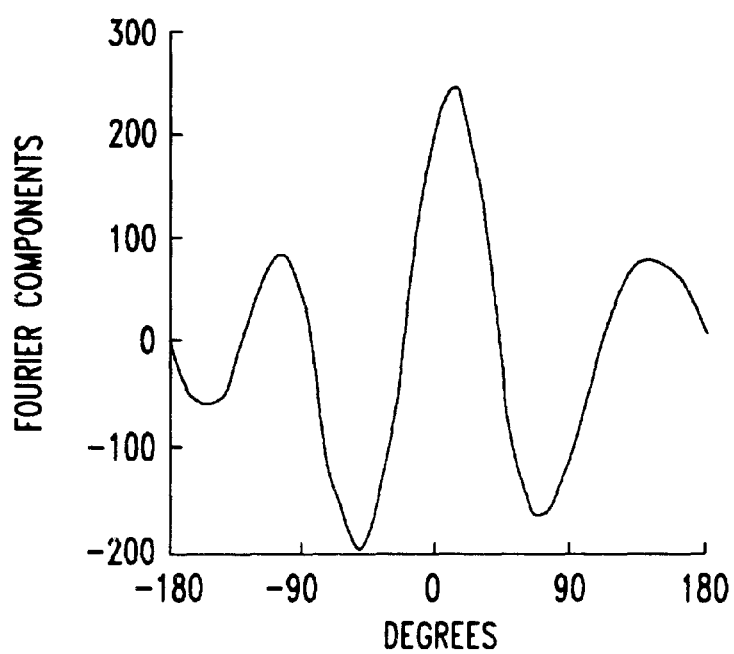
FIG. 5 shows a Cartesian coordinate plot of Fourier-like transform OES spectrum data signals at a single sampling time.
Figure 6:
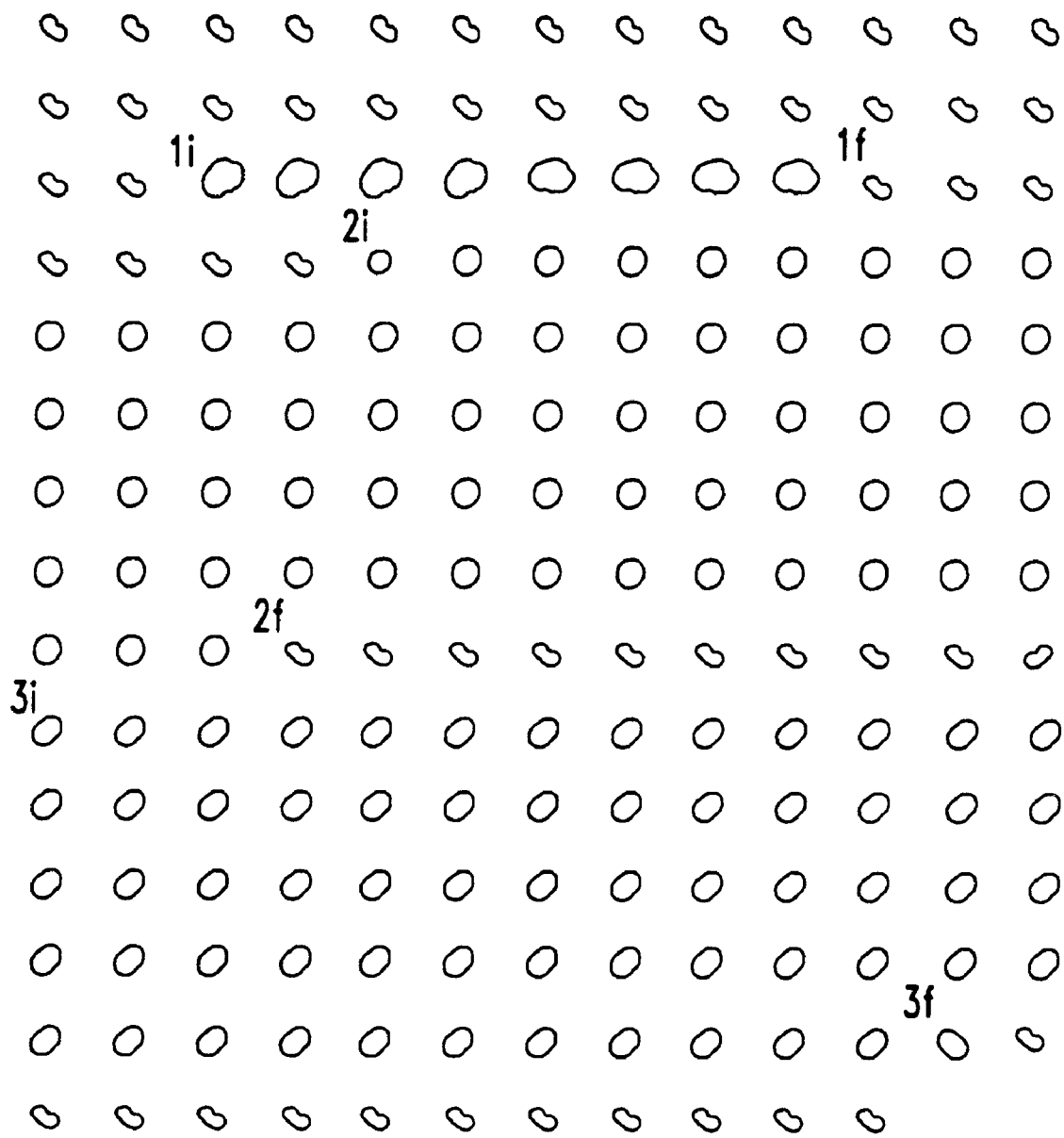
FIG. 6 shows a time sequence of Fourier signals plotted in polar coordinates.

In the '215 patent, the information was plotted on polar coordinates to yield a plot of the form of FIG. 4, which includes plots of data in accordance with Eq. 1 for the entire data set, i.e., $[I_1, \ldots I_m]$ for all sample times, t. The plot of data in accordance with (Eq. 1) for one instant in time is shown in FIG. 5. These data can be represented by a time sequence (with time increasing from left to right on a line, and from top to bottom for lines) of blobs, where each blob in a display would represent the state of the monitored process at a discrete time t as shown in FIG. 6 in which the reference numerals $1i$, $1f$, $2i$, $2f$, $3i$ and $3f$ represent the start and finish of three separate etching steps of the process. The overall set of blobs would depict the dynamic flow of monitored variables as the etching process continues.

Changes that occur in the blob shape would be identified with the approach to the polysilicon etching endpoint. Blobs following this transition reflect overetch processing. It will be clear to those skilled in the art that particular other blob shape transitions can be identified with corresponding changes in the plasma etch environment.

The process as described above, and explained in greater detail in the '215 patent, obtains information from currently available in situ process signals to detect subtle changes that indicate endpoint to a process or subsystem failure, (e.g., reactor component failure). As noted above, the Fourier-like transform is a useful mapping algorithm to allow humans to process a large number of in situ process signals for endpoint determination. In the present invention, the use of Fourier series and polar coordinate displays to observe the endpoint in plasma etch processes are extended to the use of other polynomial functions and to the detection of endpoints without conversion to a polar coordinate display. An m-dimensional time stream from time t=1 to t=n can be expressed as follows:

$$\begin{bmatrix} I_1(t=1), & I_2(t=1), & \ldots & I_m(t=1) \\ I_1(t=2) & I_2(t=2) & \ldots & I_m(t=2) \\ \ldots & \ldots & \ldots & \ldots \\ I_1(t=n) & I_2(t=n) & \ldots & I_m(t=n) \end{bmatrix}$$

At each instant in time the data from the observations are used as the coefficients to write a function of the following form:

$$f(\theta, t) = \frac{I_1}{\sqrt{2}} + I_2\sin\theta + I_3\cos\theta + I_4\sin2\theta + \qquad \text{(Eq. 1)}$$
$$I_5\cos2\theta + I_6\sin3\theta + \ldots$$

In this function t is the time increment and the system generates a function at each instant of time by varying θ between $[-\pi,\pi]$. The above Fourier-like function and its use in endpoint algorithms is used in the '215 patent. The present invention illustrates the use of other orthogonal functions in gate etch, metal etch, and via etch processes, and extends the method of analysis beyond the disclosed visual blob techniques.

When examining the population of process signals (from a batch of wafers) as a function of time, some of them will show an endpoint signal sometimes and at other times the signal is lost in the noise. For example, the RF impedance matching network monitors the magnitude of the error and the phase between the RF applied and the RF reflected. Other devices monitor the wall temperature and the temperatures of the upper and lower electrode. From these five process signals perhaps one of them (any one) may have an endpoint signal. Phase and magnitude are the most likely to show an endpoint signal but it may not always be present in either or both. So with that partial knowledge, it is desirable to combine all the process signals with some mapping algorithm to produce a scalar number as a function of time to thus improve the likelihood of finding an endpoint. If it is known in advance, from examining a population of process signals, which will be more likely to show a good endpoint signal and which will not, that knowledge can be used to select the sequence of coefficients for use in mapping relations similar to Eq. 1

All the examples discussed here are from a via etch process on 200 mm wafers in a TEL65DD using $C_4F_8/O_2/Ar/CO$ chemistries. The bottom electrode on which the wafer sits is powered at a frequency of 13.56 MHz, while the top electrode is grounded. The nominal via size is 0.24 μm. The process has 3 steps: (1) a high power, low pressure SPARC (spin on antireflective coating) etch for 20s, (2) high power, low pressure timed etch for 75s, and (3) low power, high pressure oxide etch step timed for 190s. The etch lands on aluminum.

In this etch process, the open area is less than 1%. As is well known, for such low open area etches, the concentration of the relevant molecular species that could indicate endpoint in the discharge is quite low. So unless one uses expensive optical detection equipment, an optical endpoint is essentially nonexistent. The method disclosed herein uses a number of process signals as coefficients in functions similar to Eq. 1 and integrates between the appropriate limits at each time instant to give area-time plots. (The integration limits are discussed for each function.) The process signals used are (1) reflected RF power, (2) dc bias, (3) upper electrode temperature, (4) wall temperature, (5) lower electrode temperature, (6) electrostatic chuck voltage, (7) electrostatic chuck current, (8) Adaptive Pressure Control valve position monitor, (9) c1 capacitor position, (10) c2 capacitor position, (11) phase difference between the RF applied and the reflected RF power, and (12) matching network error magnitude. These coefficients are used in this order with the following corresponding polynomial powers in evaluating functions. The powers are: (12, 12, 2, 2, 0, 12, 12, 12, 12, 12, 0, 0). The zero power simply indicates that the function will not be used but rather a term similar to the first term in Eq. 1. The powers of 12 will have less impact on the final scalar than the lower powers. The actual order of the signals (e.g. reflected power before dc bias) and the order of the polynomial are selected by empirical means to give the maximum signal.

For purposes of discussion, the normalized applied RF power is plotted in each of FIGS. 7–25 as a clock signal. This applied RF power signal shows the process changes for each of the three steps. The first step is 20 seconds. The second step is 75 seconds, and the third step is 190 seconds. From SEM cross sectional studies, it is known that in the beginning of the third etch step there is a few hundred angstroms of oxide remaining prior to the titanium nitride (TiN) barrier layer. When the TiN layer etch has first broken through, the plasma has encountered an aluminum film. This TiN film does not clear instantly nor uniformly, but takes about 2 second. The set of process signals are selected because they sometimes show a signal at endpoint. About 60–70% of the wafers will show an endpoint signal in one or more of the process signatures; because of the speed of the matching network, and other adaptive systems (e.g., pressure), compensating for plasma impedance changes, the process signatures sometimes do not show the endpoint signal. It is believed the lack of endpoint signal could be circumvented with a higher sampling frequency.

Based on the etch rate during the third step and from SEM cross sectional studies, it is known that the endpoint should occur about 60 seconds after the start of the third step. Accordingly, the plot of the applied RF power should show an endpoint signal about ¼ to ⅓ of the way into the third etch step if such a signal is present.

The following discusses the use of the Chebyshev polynomial for process signal analysis. The Chebyshev polynomials are given by $$T_n(x) = \cos[n \arccos x].\qquad \text{Eq. 2}$$

This trigonometric appearing function can be transformed into polynomials by de Moivre's identity formula and expanding, and can be written as a polynomial of θ in degree n.

$$T_0(\theta)=1$$
$$T_1(\theta)=\theta$$
$$T_2(\theta)=2\theta^2-1$$
$$T_3(\theta)=4\theta^3-3\theta$$
$$T_4(\theta)=8\theta^4-8\theta^2+1$$

. . .

$$T_{n+1}(\theta)=2\theta T_n(\theta)-(\theta)-T_{n-1}(\theta)$$

Figure 7A:
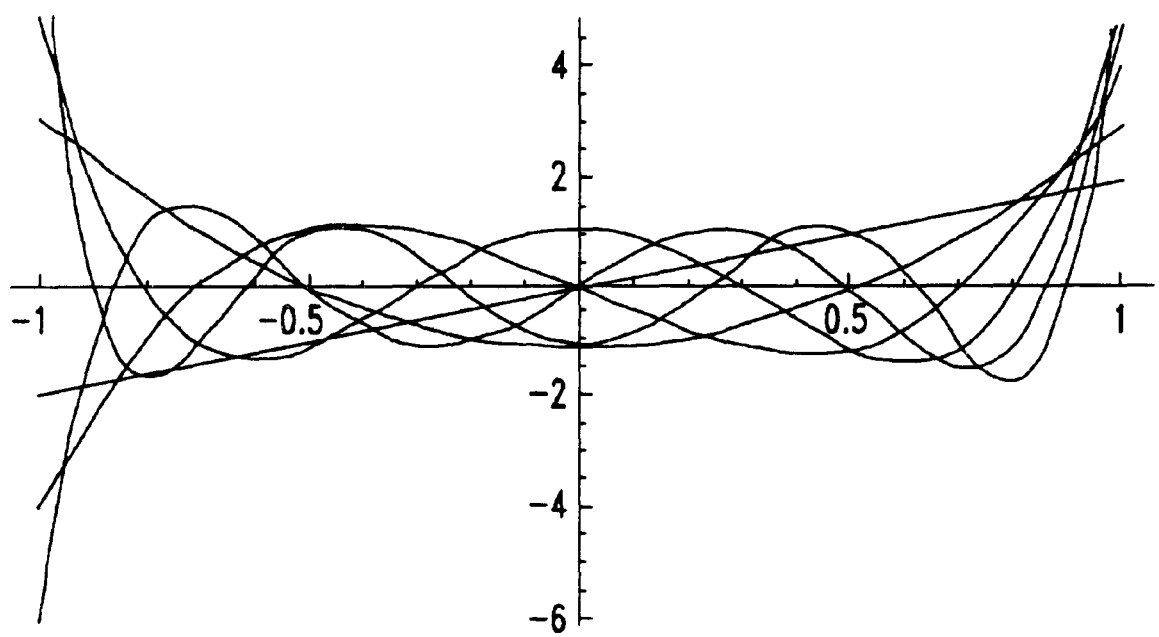
FIG. 7A shows plots of the first six Chebyshev polynomials.

A graph of the first six Chebyshev polynomials are shown in FIG. 7A. At the endpoints (i.e., −1 and +1) the function diverges.

A function can be defined using the Chebyshev polynomials like the Fourier function in Eq. 1 uses trigonometric functions. In this case, the fiction to transform the data is $$f(\theta,t)=I_1T[0,\theta,t]+I_2T[1,\theta,t]+I_3T[2,\theta,t]+\ldots+I_mT[m,\theta,t]\qquad \text{Eq. 3}$$

where $I_1$ represents the data at a particular instant in time and $1<i<m$. The first argument to the Chebyshev function T[ ] is the order of the polynomial and the second argument, the variable θ, is allowed to vary between −1 and +1, and of course the function is computed at a particular instant in time.

Figure 7B:
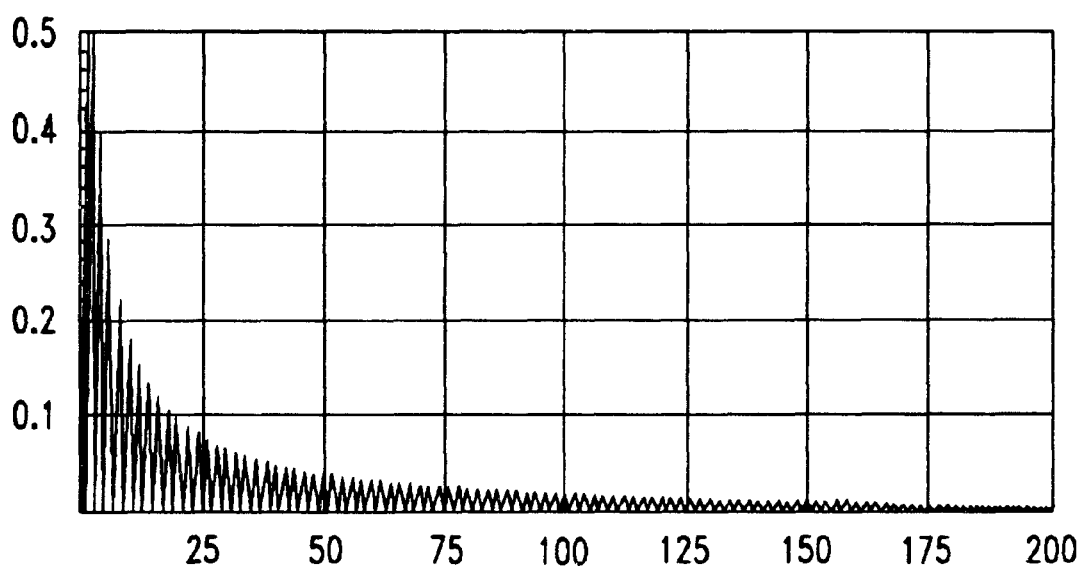
FIG. 7B shows numerical results for evaluation of the definite integral of the Chebyshev-like polynomials up to the order of 200 where integration was done between the limits—1 to 1.

The function in Eq. 3 is not a scalar number, but can be converted to a scalar number by finding the area of the function between the appropriate limits to cover one period. For the Fourier blobs case, one would integrate between [−π,π] and for the Chebyshev polynomial case, one would integrate between [−1,1]. The first term in Equations 1 or 3 will strongly dominate the result from the integration (i.e., lowest order polynomial). The terms after that will have diminishing effects on the result, i.e., the scalar number. FIG. 7B shows a plot of the integrals for a series of Chebyshev polynomials.

Figure 8:
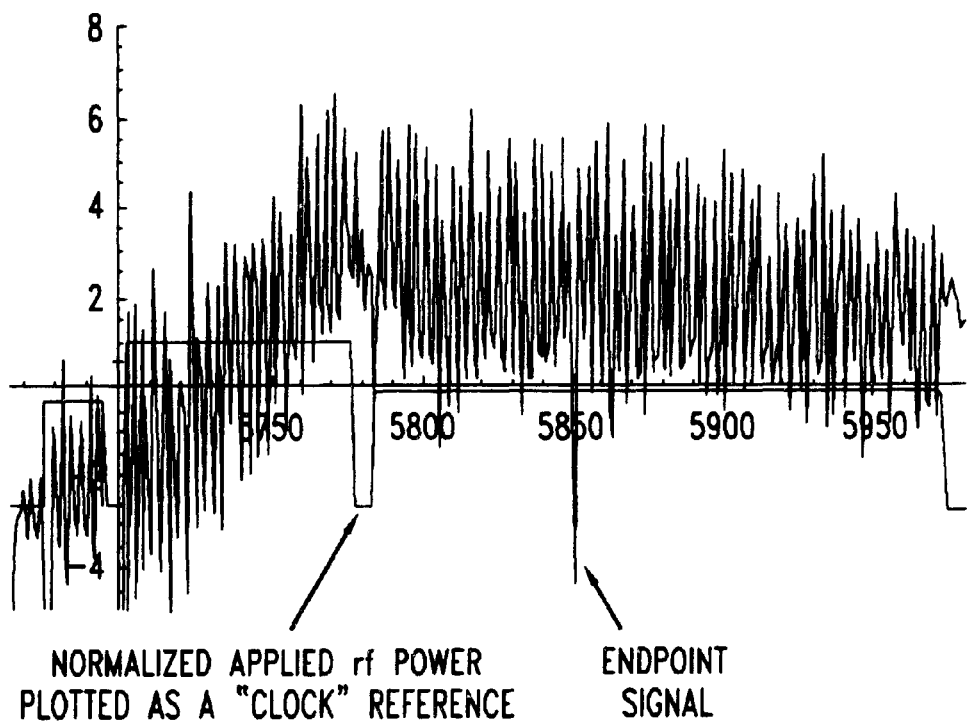
FIG. 8 is an area-time curve for a Chebyshev based endpoint function.

FIG. 8 is a plot of the integrated Chebyshev function given in Eq. 3 for a via etch of 0.16 micron. The actual results plotted are the area-time curve. The area, α, is computed from $$a(t) = I_1\int_{-1}^{1} T[O,\theta,t]d\theta + I_2\int_{-1}^{1} T[1,\theta,t]d\theta + \qquad \text{Eq. (4)}$$
$$I_3\int_{-1}^{1} T[2,\theta,t]d\theta + \ldots + I_m\int_{-1}^{1} T[m,\theta,t]d\theta$$
$$= \int_{-1}^{1} \sum_{i=1,d=0}^{i=m,d=m-1} I_1, T[d,\theta,t]d\theta$$

Figure 9:
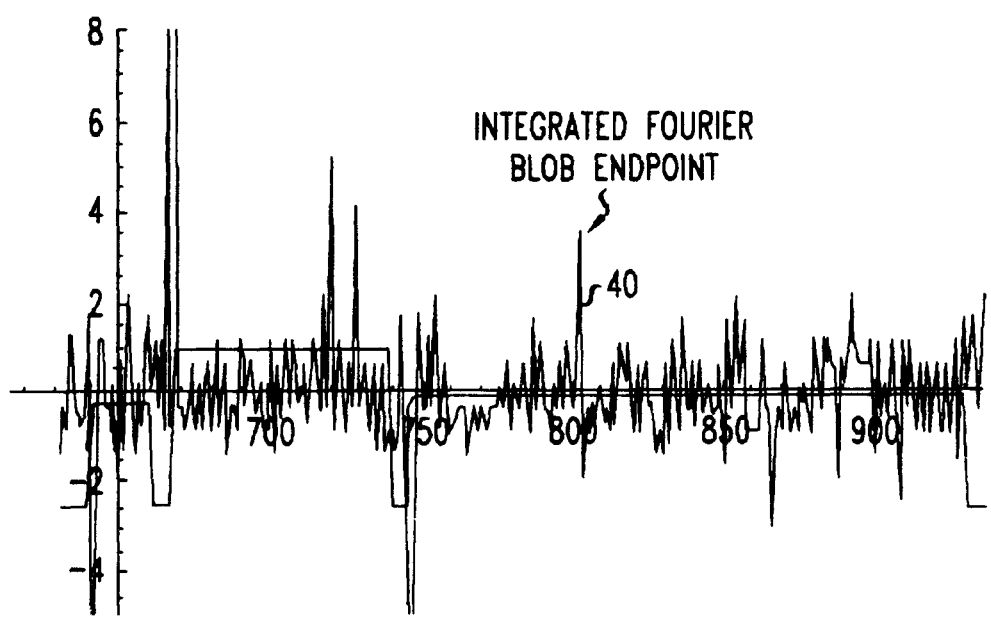
FIG. 9 is an area-time curve for Fourier based endpoint function.

For comparison, FIG. 9 shows the integrated Fourier analog for another of the wafers in the same lot. In each case, the m-dimensional vector of process signals is reduced to a one-dimensional vector (i.e. a scalar) and the endpoint 40 is visible in the time-trace of the area. Note that the endpoint signal at 40 in each of the Chebyshev and Fourier plots is identified by an amplitude spikeoccurring at about the expected time interval.

Another orthogonal series function, Legendre Polynomial, can be used for signal processing similar to the Chebyshev function. The Legendre differential equation is $$(1-\theta^2)y''-2\theta y'+1(1+1)y=0$$

where 1 is a constant. Assuming a series solution for y and differentiating term by term twice to get y' and y" yields as follows:

$$Y=\alpha_0+\alpha_1\theta+\alpha_2\theta^2+\alpha_3\theta^3+\ldots$$
$$Y'=\alpha_1+2\alpha_2\theta+3\alpha_3\theta^2+4\alpha_4\theta^3+\ldots$$
$$Y''=2\alpha_2+6\alpha_3\theta+12\alpha_4\theta^2+\ldots$$

Collecting the coefficients for the powers produces:

$$a_{n+2} = -\frac{l(l-n)(l+n+1)}{(n+2)(n+1)}a_n$$

Where the constants $a_0$ and $a_1$ are determined by the initial conditions. The final solution to the differential equation is given by $$y = a_0\left[1 - \frac{l(l+1)}{2!}\theta^2 + \frac{l(l+1)(l-2)(l+3)}{4!}\theta^4 - \ldots\right] +$$
$$a_1\left[\theta - \frac{(l-1)(l+2)}{3!}\theta^3 + \frac{(l-1)(l+2)(l-3)(l+4)}{5!}\theta^5 - \ldots\right]$$

For individual 1 values there is a series of polynomials known as the Legendre polynomials.

$$P_0(\theta)=1$$
$$P_1(\theta)=\theta$$
$$P_2(\theta)=½(3\theta^2-1)$$
$$P_3(\theta)=½(5\theta^3-3\theta)$$
$$P_4(\theta)=⅛(35\theta^4-30\theta^2+3)$$

Figure 10:
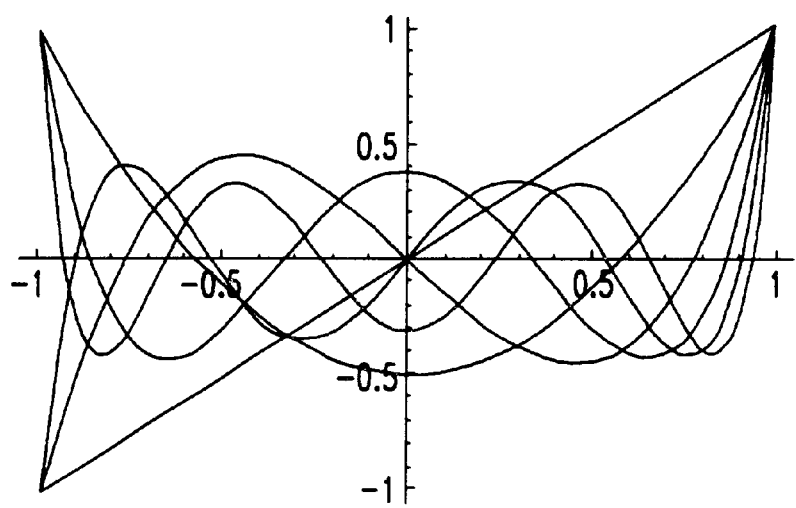
FIG. 10 shows Cartesian coordinates plotted for the first six Legendre polynomials.

The first six Legendre polynomials are plotted in FIG. 10.

As was done for the Chebyshev polynomials, a function like that of Eq. (3) can be used to transform some plasma machine parameters (process signals) in real time.

$$f(\theta,t)=I_1L[0,\theta,t]+I_2L[1,\theta,t]+I_3L[2,\theta,t]+\ldots +I_mL[m,\theta,t] \quad \text{Eq. (5)}$$

As before, $I_t$ represents the data from at a particular instant in time and $1<i<m$. The first argument to the Legendre function L[ ] is the order of the polynomial and the second argument, the variable $\theta$, is allowed to vary between $-1$ and $+1$ at a particular instant in time.

Figure 11:
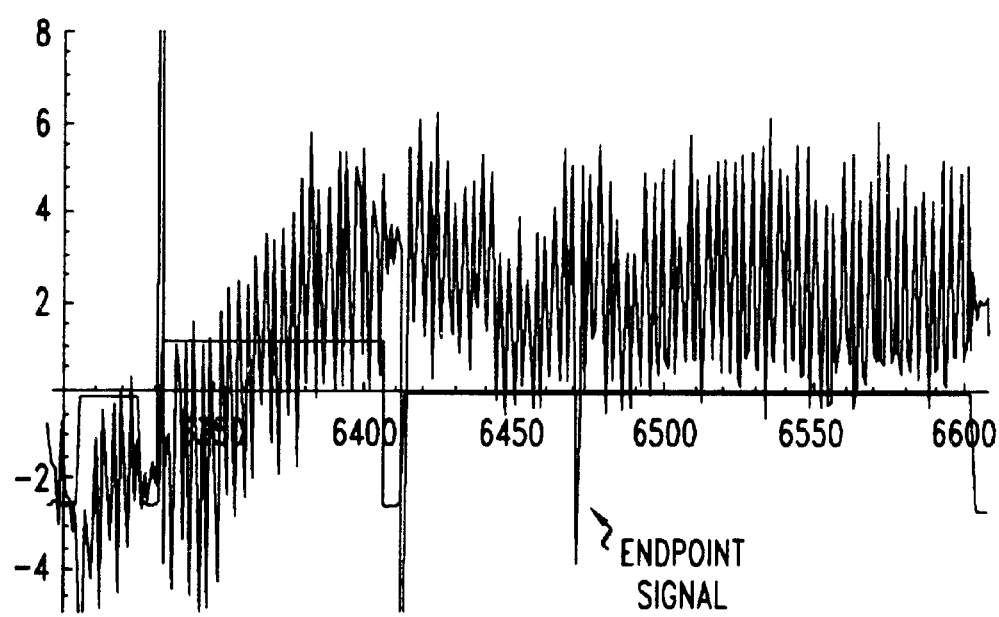
FIG. 11 is an area-time curve for Legendre based endpoint function.
Figure 12A:
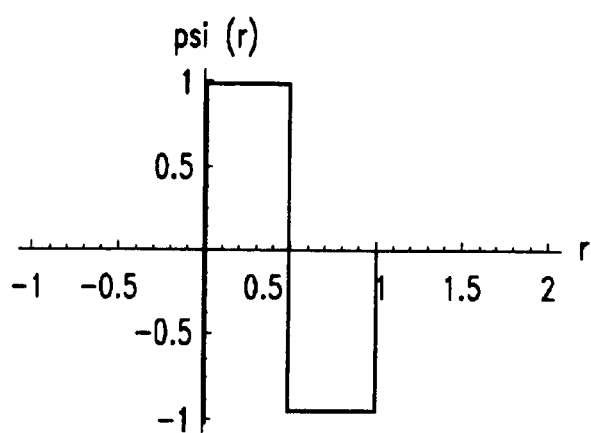
FIGS. 12A–12D are Cartesian coordinate plots for the first few modified Haar wavelet basis functions.
Figure 12B:
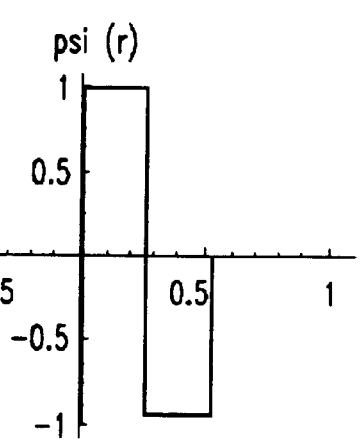
Figures 12C, 12D:
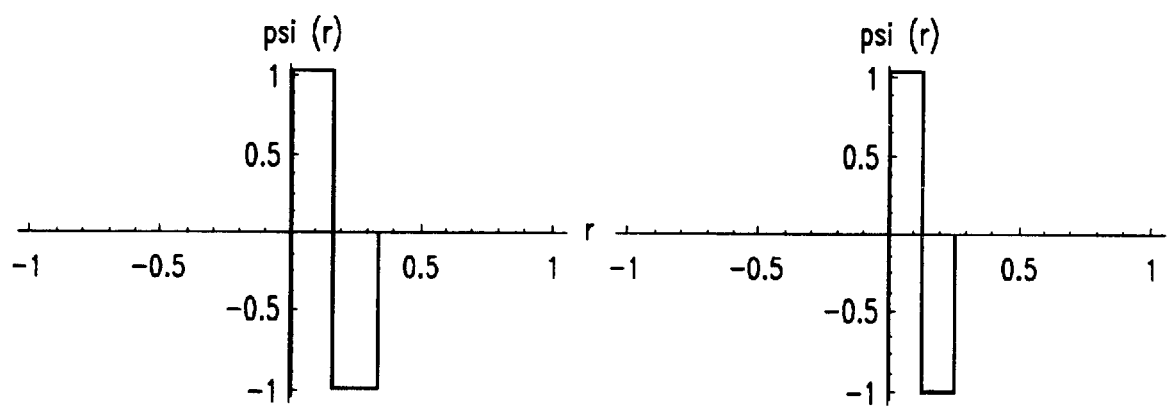

After carrying out the area integration (analogous to Eq. 4) with the Legendre polynomials at each time increment, one can generate the area-time curve shown in FIG. 11. This figure is for a wafer from the same lot of 0.16 micron technology. The curve in this figure has similar shape to that in FIG. 9 because the dominant coefficients in the analog of Eq. 3 are the same.

Another form of analysis can be implemented using wavelets. Wavelets are functions obtained by translations and dilations of some other function. For example, the box function $$\phi(r) = \begin{cases} 1 & 0 \leq r < 1 \\ 0 & \text{otherwise} \end{cases}$$

is used to build the Haar wavelet. The Haar wavelet is given by $$\psi(r)=\phi(2r)-\phi(2r-1) \quad \text{Eq. (6)}$$

and plotted in FIGS. 12A–12D.

The wavelet transform, like the Fourier transform, can be expressed as an integral transform. The continuous windowed Fourier transform is given by $$(T^{window}f)(w,t)=\int ds f(s) g(s-t) \exp(-iws),$$

and the continuous wavelet transform is $$(T^{wavelet}f)(a,b) = |a|^{-1/2} \int dt f(t)\psi\left(\frac{t-b}{a}\right).$$

In the wavelet transform a and b are called the dilation and translation parameters and they vary over R, and a is not equal to zero. In this case $\psi$ is some kernel functional Though there are many kernel functions, this example uses the Haar wavelet.

To use the Haar wavelet transform, Equation (6) is modified as follows:

$$\psi(r,\theta)=\phi(\theta r)-\phi(\theta r-1)$$

Letting the compression factor $\theta=[0,1]$ be the changing variable is analogous to changing the arguments to the trigonometric functions in Eq. (2) and allows creation of a plot similar to that shown in FIG. 1. In this case (FIG. 13), one gets a different curve for each time increment during the etch, and the entire ensemble of curves represents the dynamics of the etch from the beginning to end. The full equation describing the transform is then given by:

$$f(t)=I_1\psi[0,\theta,t]+I_2\psi[1,\theta,t]+I_3\psi[2,\theta,t]+I_4\psi[3,\theta,t]+\ldots \quad \text{Eq. (7)}$$

In this case, like the others, the elements of the data vector, $I_1$, become the coefficients multiplying the wavelet function acting on the variable $\theta$. Integrating (i.e., the analog of Eq. 4) from [0,1] for all time increments yields FIG. 14. The endpoint signal 40 occurring within the expected time interval is obvious in the graph of FIG. 14.

In many cases a rare event will show little impact on additive processes but could dominate multiplicative processes. This suggests that the formula in Eq. (2) may be modified for the following type of function $$f(\theta, t) = \left[\frac{I_1}{\sqrt{2}}\right] * [I_2\sin\theta] * [I_3\cos\theta] * [I_4\sin 2\theta] * \quad \text{Eq. (8a)}$$
$$[I_5\cos 2\theta]*[I_6\sin 3\theta]*\ldots$$

and the "area" analog would be written as $$a(t,\theta) + \int_{-\pi}^{\pi} \prod_1 I_1 F_1[\theta]d\theta. \quad \text{Eq. (9)}$$

Similarly, all the other equations for the Chebyshev functions, the Legendre functions and the Haar wavelet functions could be modified to obtain the following $$a_{chebyshev}(t, \theta) = \int_{-1}^{1} \prod_i I_iT_i[d, \theta, t]d\theta \quad \text{Eq. (10)}$$

$$a_{legendr}(t, \theta) = \int_{-1}^{1} \prod_i I_iT_i[d, \theta, t]d\theta \quad \text{Eq. (11)}$$

$$a_{haar-wavelet}(t, \theta) = \int_{-1}^{1} \prod_i I_i\psi_1[d, \theta, t]d\theta \quad \text{Eq. (12)}$$

In these equations, d represents the order of the polynomial, $\theta$ is the variable of integration and t is the time instant. One of these integrals' is computed at each instant in time using the vector of process signals.

Carrying out the above indicated computations and plotting the functions versus time results in FIGS. 15–18. In numerical order the figures are the "Fourier", "Chebyshev", "Legendre", and "Haar" wavelet functions. As can be seen from the figures, the Fourier and Haar wavelet function techniques, when applied as products, show very low amplitudes. Since the basis functions are simply multipliers, the functions can be selected empirically to give the best results. Though this technique works well enough for the sums of functions, the approach breaks down for products of functions. Some of this is likely due to the strong orthogonality of the basis sets. Recall that the orthogonality condition is given by $$\int_a^b \phi_m(x)\phi_n(x)dx = \begin{cases} 0 & m \neq n \\ \neq 0 & m = n \end{cases}$$

$$\int_a^b \phi_n^2(x)dx \text{ for all } n$$

Figure 13:
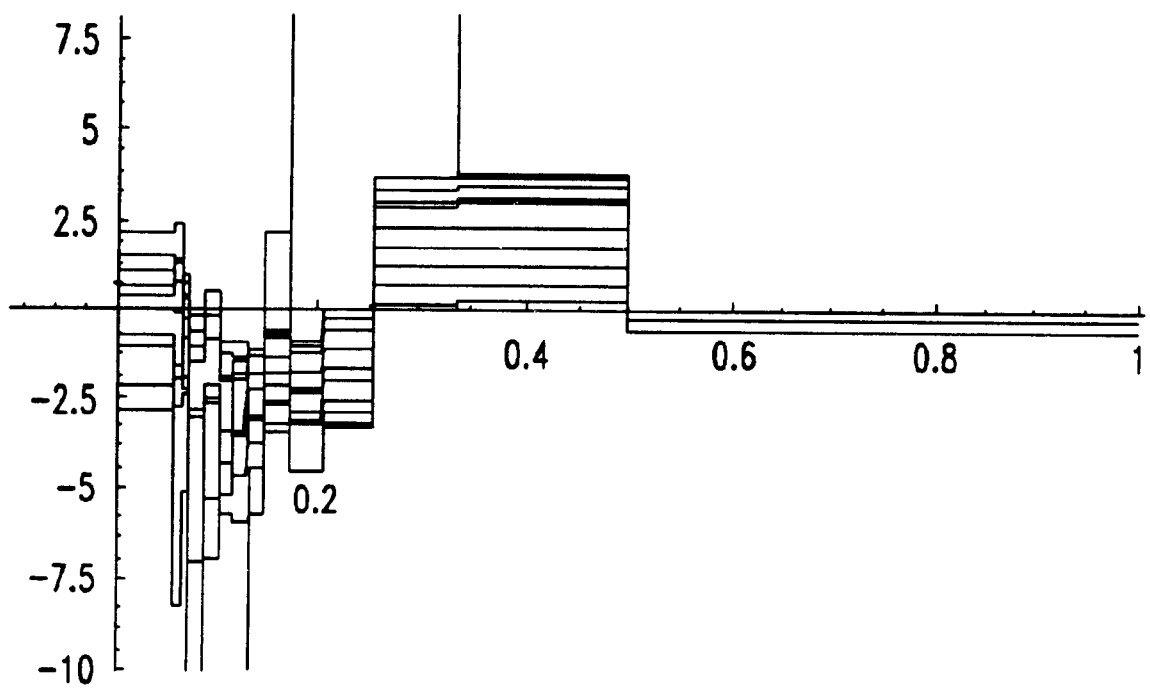
FIG. 13 is a plot of process data from multiple signals in an etch process for the modified Haar wavelet basis function.
Figure 14:
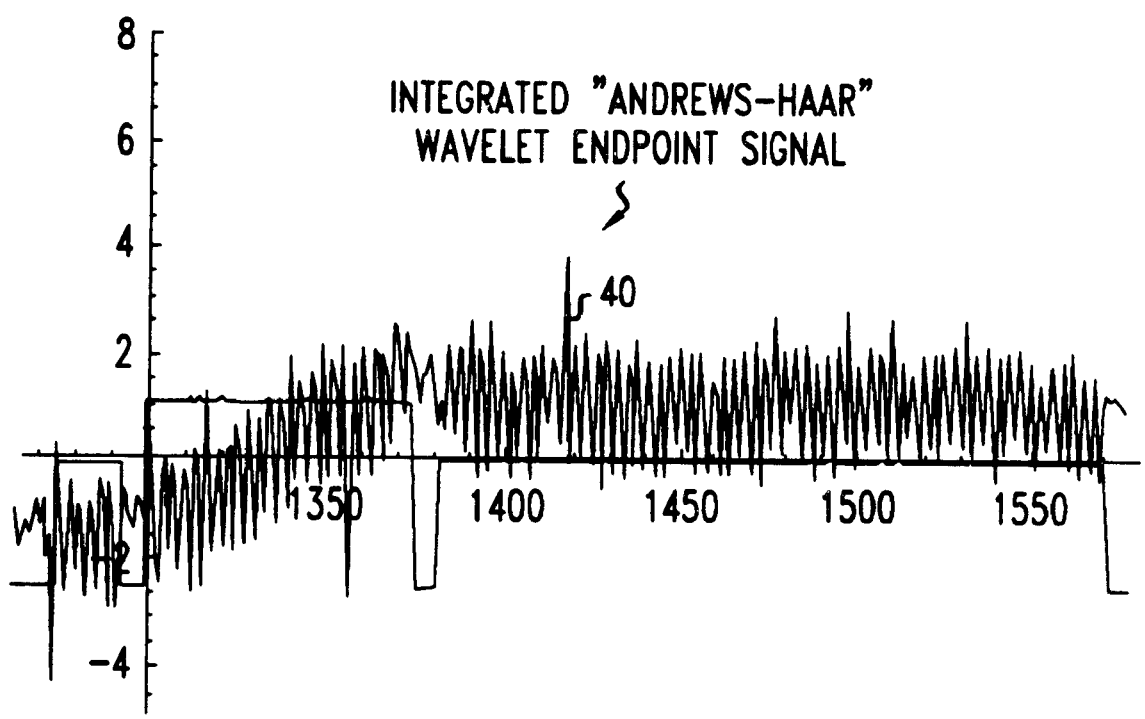
FIG. 14 is an area-time curve for modified Haar wavelet based endpoint function.
Figure 15:
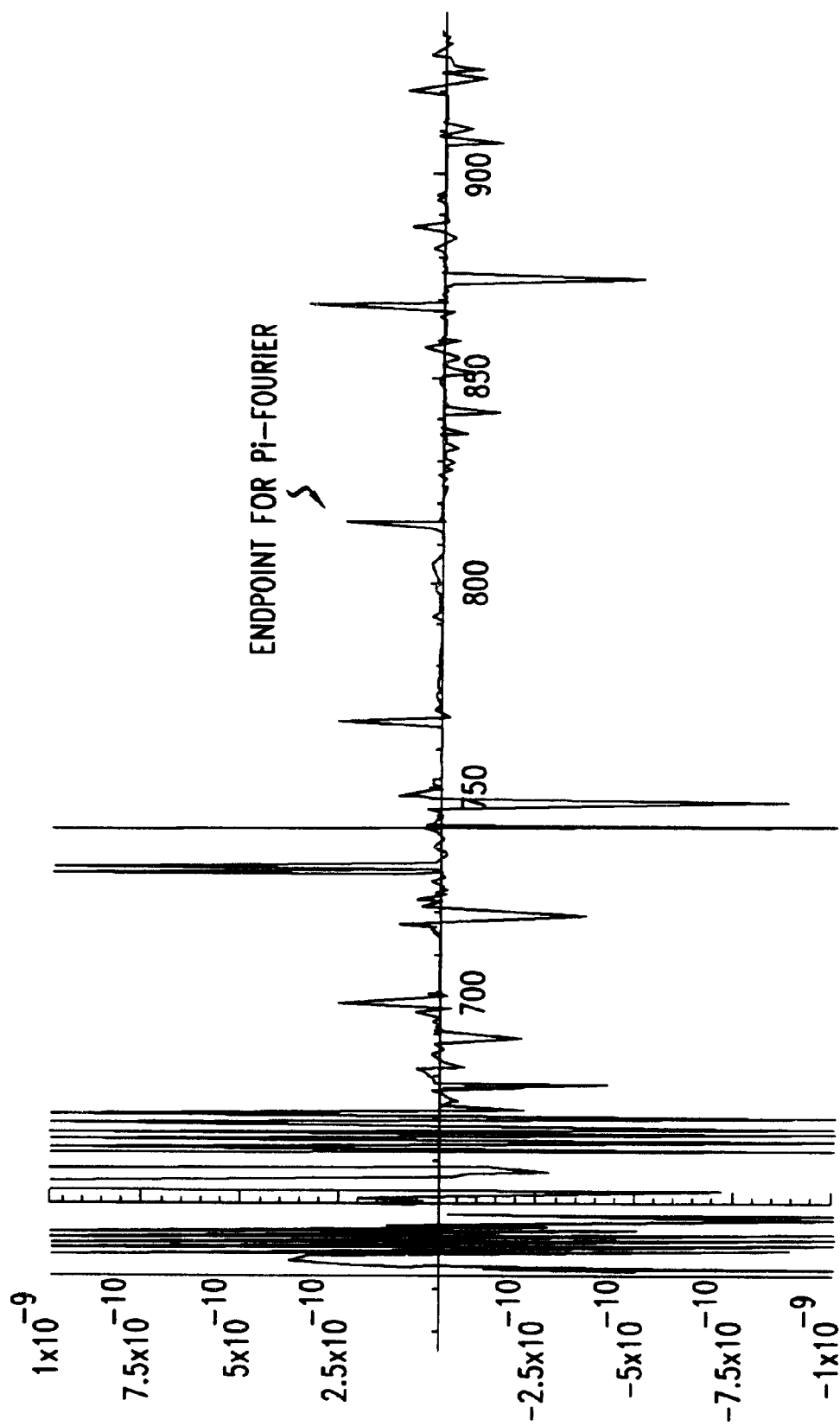
FIG. 15 is an area,time curve for product of Fourier functions.
Figure 16:
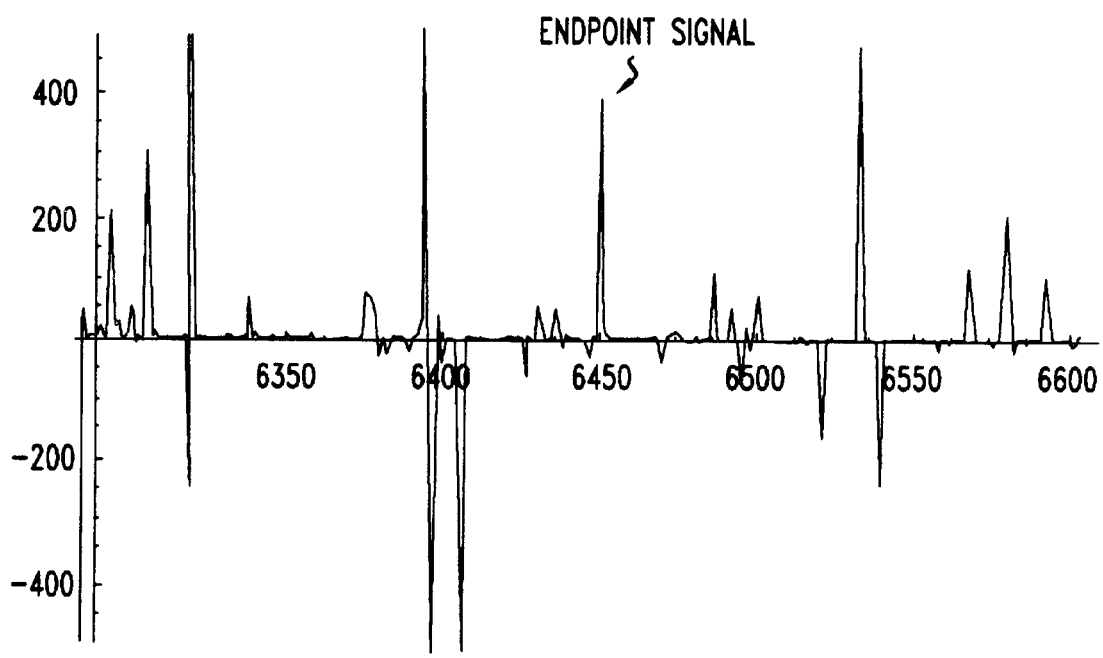
FIG. 16 is an area-time curve for product of Chebyshev function.
Figure 17:
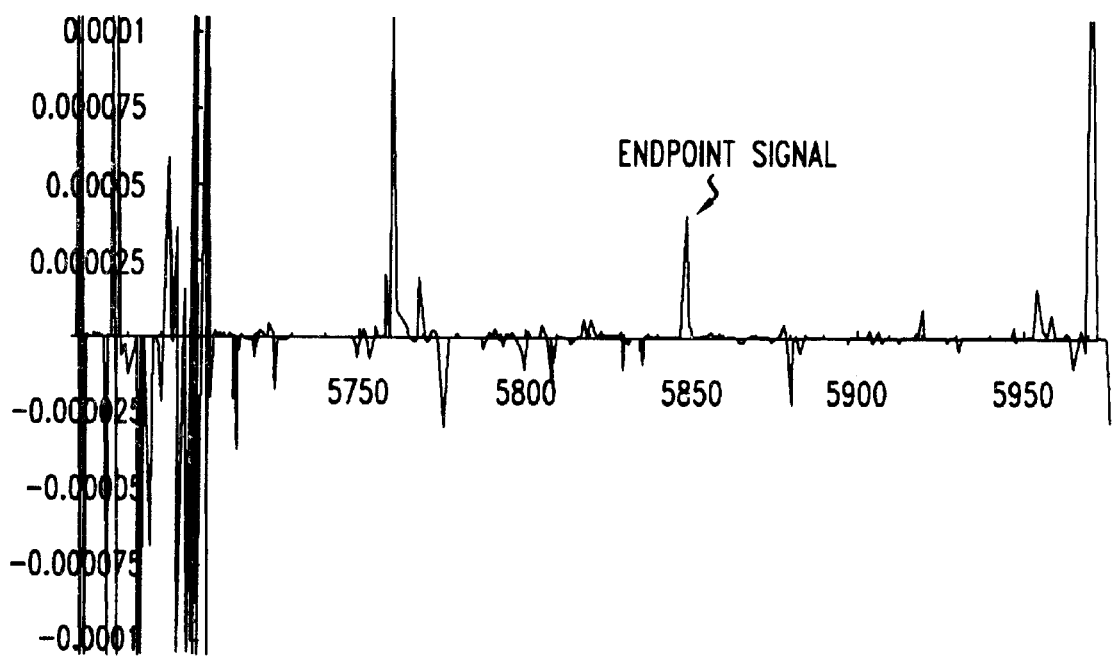
FIG. 17 is an area-time curve for product of Legendre function.
Figure 18:
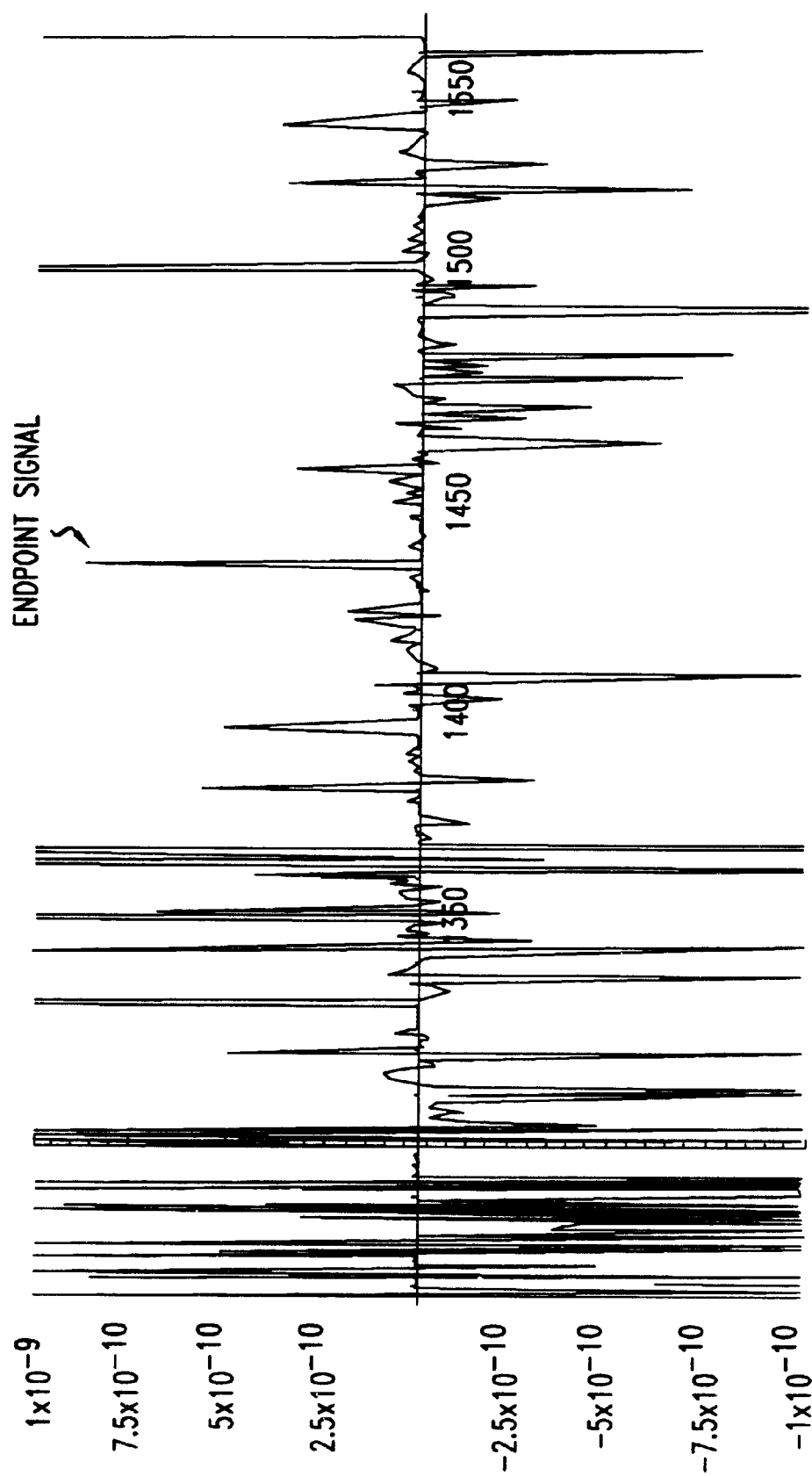
FIG. 18 is an area-time curve for product of modified Haar wavelet function.
Figure 19:
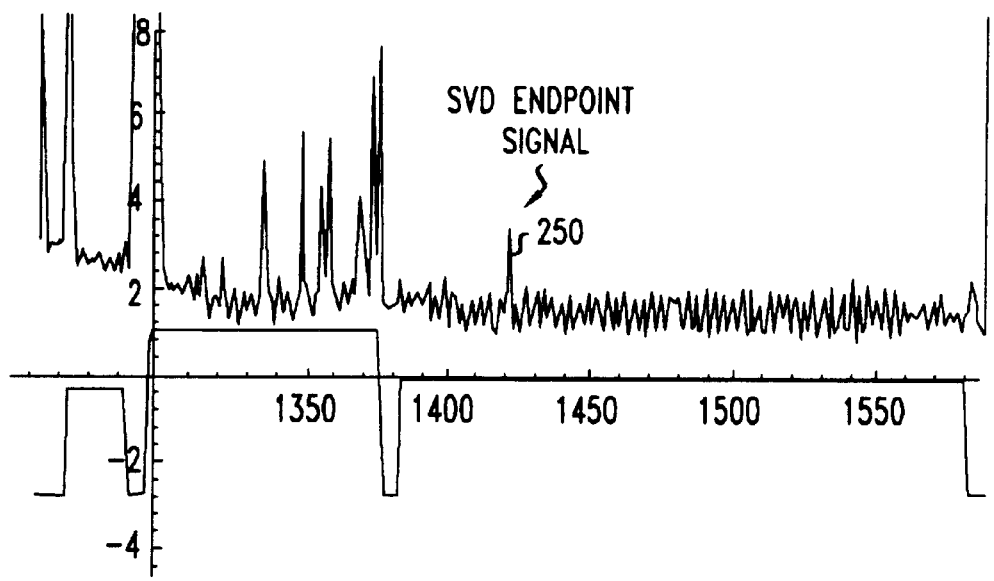
FIG. 19 is an area-time curve for SVD relation.

So the results presented in FIGS. 15 and 18 are likely pushing the limits of computational precision. The results in FIGS. 12 and 13 are more reliable due to the fact of selecting a biased set of functions corresponding to the following polynomial order(s): 12, 12, 2, 2, 0, 12, 12, 12, 12, 12, 0,0. The fifth and the last two terms will not be orthogonal functions but will be like the first term in Equation (2). In running simulations of the trigonometric function in Eq. (2) and setting the fifth and last two terms equal to $I_1/\sqrt{2}$ or even drop the factor of $1/\sqrt{2}$ the results are similar to those presented in FIG. 15. In further simulations, if all the trigonometric functions are dropped and just the product of the vector elements are found, one obtains a graph similar to that shown in FIG. 15. In this case, clearly there is no orthogonality involved. The product of small numbers is smaller numbers. So the product of 12 small numbers is a very tiny number.

The Andrews, plots and their variations are unconventional methods for the mapping of multiple signals to one signal, i.e., $R^m \to R$ They do, however, preserve the variance of the process signals. Some classical mapping methods also preserve variance and provide capabilities for endpoint detection. A mathematical technique known as singular value decomposition (SVD) is a useful method to find the eigenvalues for an m×n matrix. When m>n, there are n singular values. For a 3×2 matrix, first find the dot product of the matrix with its Hermitian transpose. This will result in a 2×2 matrix. The singular values are then found from the square root of the eignevalues of this matrix.

In the present example, the in situ process signals can be written as an m×1 matrix, A(t). If, for example, there are six process signals at each instant in time, one can decompose this 6×1 matrix. If one of the signals' elements is stronger (i.e., larger or much smaller) than the others, there will be one element in the matrix large (or smaller) by δ. How this increase (or decrease) in one element effects the singular value will determine the sensitivity of the method. Let the matrix, A, be given by $$A^T = \begin{bmatrix} a_1 \\ a_2 \\ a_3 \\ a_4 + \delta \\ a_5 \\ a_6 \end{bmatrix}$$

The product of this and its hermitian transpose is given by $$A^H A = [\alpha_1^2 + \alpha_2^2 + \alpha_3^2 + (\alpha_4 + \delta)^2 + \alpha_5^2 + \alpha_6^2]$$

Of course, for this simple case, the eigenvalue of this 1×1 matrix is simply the matrix again and the singular value is the square root. So the singular value is:

$$\sqrt{\alpha_1^2 + \alpha_2^2 + \alpha_3^2 + (\alpha_4 + \delta)^2 + \alpha_5^2 + \alpha_6^2}$$

Figure 20:
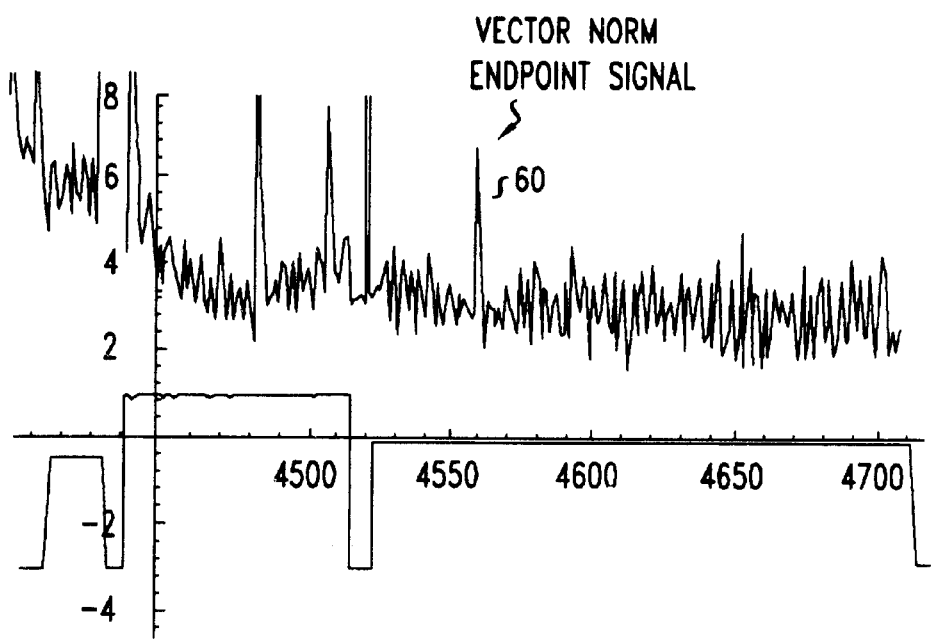
FIG. 20 is an area-time curve for vector norm based endpoint.

Not coincidentally, the singular value is also equal to the vector norm $\|A\|$ in m×1 matrices. In more complex cases, this is not so. Even a 3×2 matrix with two singular values would require extensive equations. However, this does suggest that a matrix norm may prove to be a useful $R^{m \times n} \to R$ map for more complex cases. For example, one could collect six process signals for n time increments, and then use this 6×n matrix to make an endpoint decision. The matrix norm of this, or perhaps the largest singular value could be used as the endpoint signal. As an example of singular value decomposition in plasma endpoint detection, consider the same process data used in the other algorithms. A singular value decomposition of the vector at each instant in time is used to generate FIG. 19. For reference purposes, plotted on the same graph, is the normalized applied RF power. It can be seen that the endpoint signal 50 is apparent from prior knowledge of the approximate time interval in which the signal should appear. FIG. 20 is an example of the vector norm method using the same data set for another wafer of the set again showing an endpoint signal 60.

As another approach to investigating the endpoint of the plasma via etch process, consider the process as a dynamic process where the signal vector is constantly changing its angle of position with respect to a unit-vector, I. One can write the cosine of the angle of these two vectors as $$\cos\vartheta = \frac{I \cdot A}{|A||I|} = \frac{I \cdot A}{|A|},$$

and explicitly for the example above, get $$\cos\vartheta = \frac{1}{\sqrt{m=6}} \frac{a_1 + a_2 + a_3 + (a_4 + \delta) + a_5 + a_6}{\sqrt{a_1^2 + a_2^2 + a_3^2 + (a_4 + \delta)^2 + a_5^2 + a_6^2}}.$$

Figure 21:
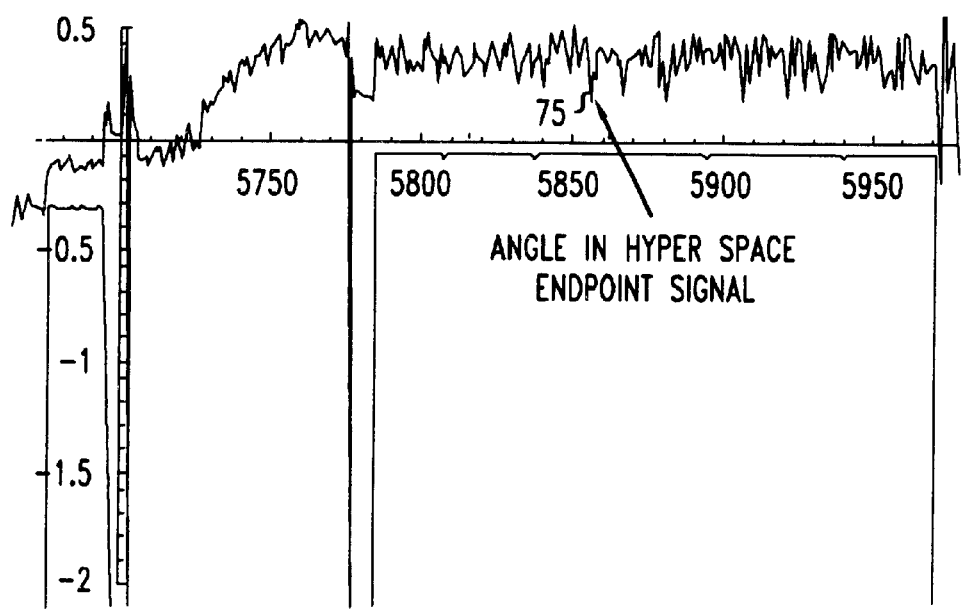
FIG. 21 is an area-time curve for angle in hyper-space based endpoint.

As an example of finding endpoint using this technique, FIG. 21 shows the endpoint trace for the same data set. Again, the endpoint signal 70 appears as an amplitude variation at about the expected time interval.

If either the position or the strength of the endpoint signal is known from experience, one could easily construct an endpoint algorithm using a neural network or an adaptive algorithm. In the case of knowing the position, a self organizing network could be used as a classifier to identify the endpoint signal. If the expected threshold and a time range are known, one could use some supervised training for a feed-forward neural network. In the case of plasma etching, one does not have a priori knowledge of where the endpoint will be, nor the strength of the signal.

One form of neural network is a simple perception network without learning such as a sigma-pi network constructed by the following equation:

$$output = \sum_{i=1}^{\frac{m(m-1)}{2}} \prod_{i,j} a_i a_j$$

Figure 22:
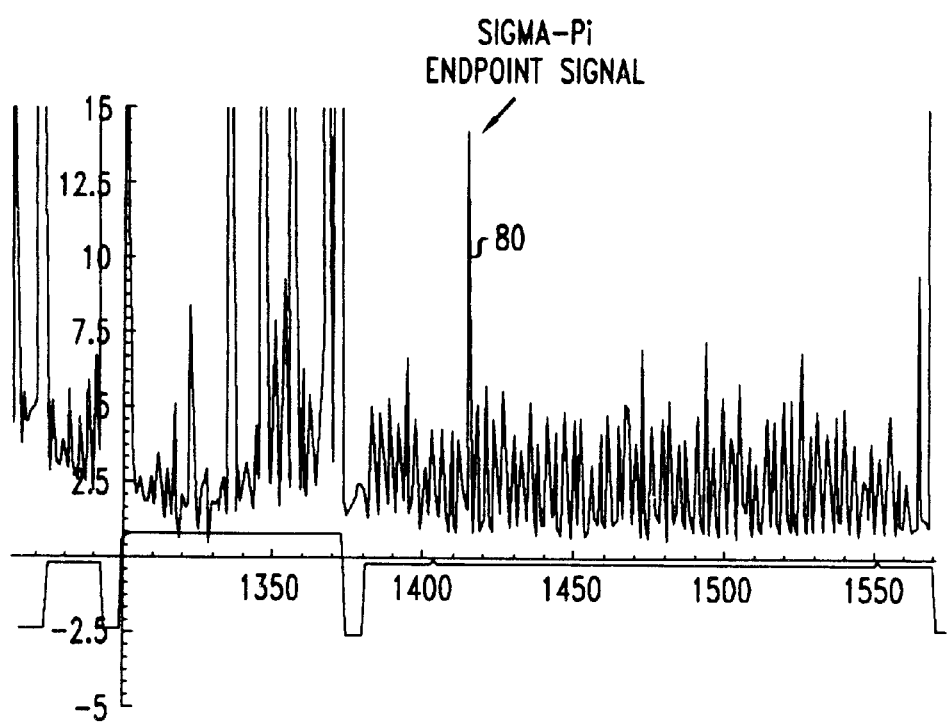
FIG. 22 is an area-time curve for sigma-pi network based endpoint.

The network output is given by the sum of all the products between the elements of the vector m-dimensional vector. This sigma-pi architecture affords some non-linearity in the calculation and yet is almost as simple as finding the vector norm. The network has no training and the connection weights are simply 1, 0. FIG. 22 shows an example of finding a process endpoint using this neural network architecture. As discussed before, the particular endpoint signal 80 is apparent given prior knowledge of the approximate time the endpoint will occur.

Still another analysis technique is possible using vector norms. A vector space for which the distance $d(X_1,X_2)$ between two vectors $X_1=(x_{11},x_{12}, \ldots ,x_{1n})$ and $X_2=(x_{21}, x_{22}, \ldots , X_{2n})$ is known as a metric space (sometimes called a vector norm). The following relation gives the Minkowski distance between any two vectors $$d_p(x) = \|X_1 - X_2\|_p = \left(\sum_{i=1}^n |x_{1i} - x_{2i}|^p\right)^{1/p}$$

where p is a real number >0. The corresponding vector spaces are known as Minkowski spaces, denoted Lp. The instantaneous version is $$d_p(x) = \sqrt[p]{|x_1 - x_2|^p}$$

Figure 23:
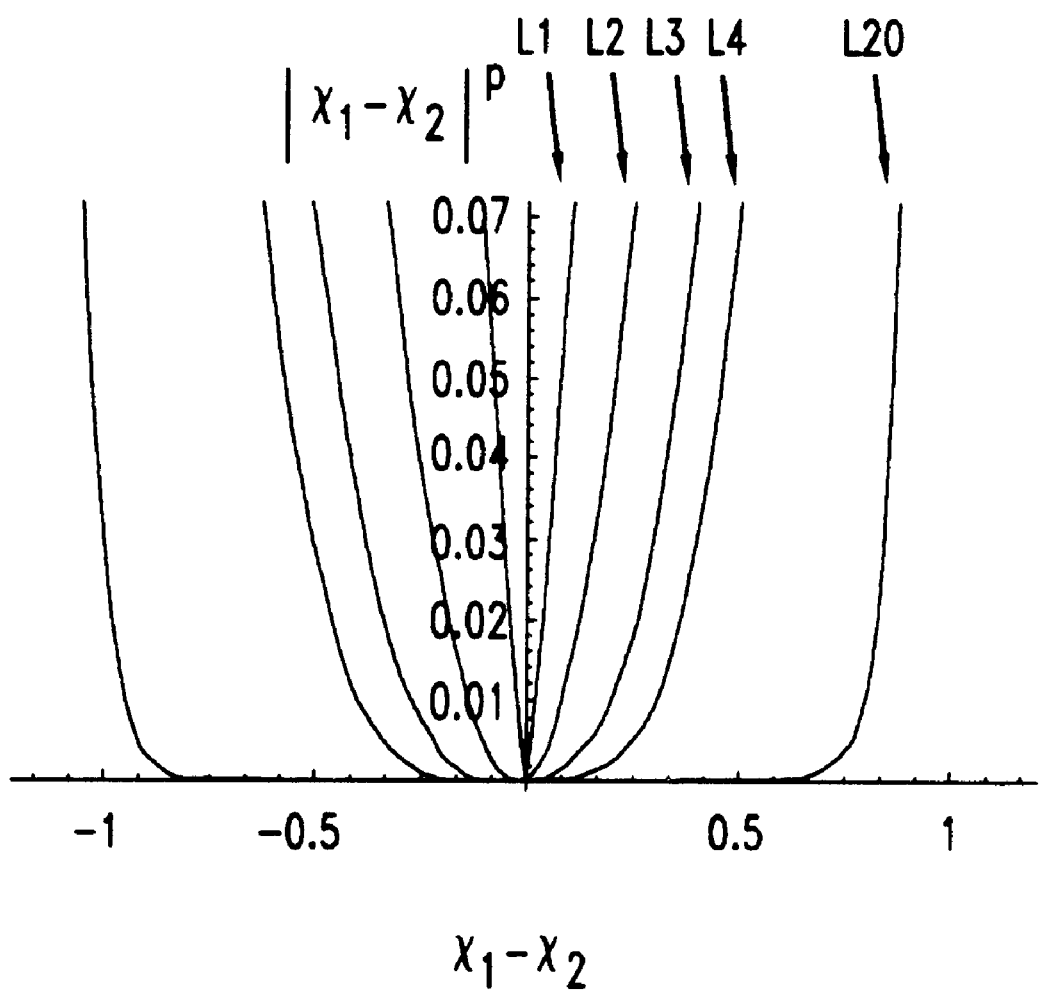
FIG. 23 is a family of Minkowski distance metrics.
Figure 24:
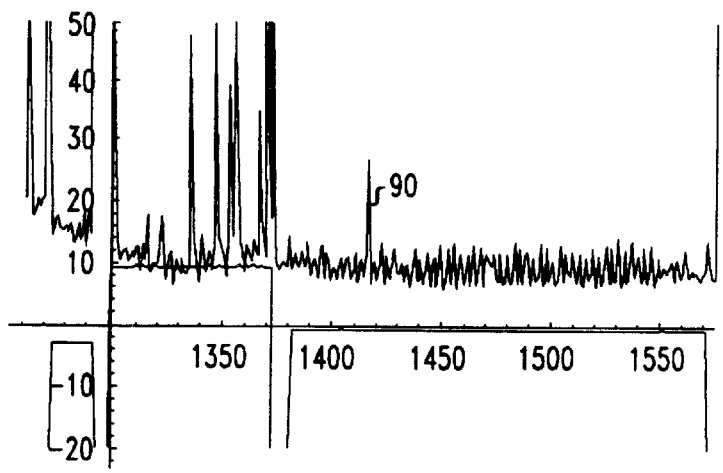
FIG. 24 is a Minkowski distance metric applied to plasma endpoint.

If p=2 and $X_1$ represents a mean value, then the instantaneous $L_2$ metric is the same as the standard deviation (in this case called the $L_2$ error or $L_2$ norm). The $L_2$ norm is sensitive to outliers, and as the outliers become more extreme the $L_\infty$ norm (called the supremum error norm) is even more sensitive, especially for the small differences. FIG. 23 shows this graphically. Applying the $L_2$ norm to the plasma process data produces endpoint traces similar to that shown in FIG. 24. Here the endpoint is clearly indicated at 90.

Observations indicate that the matching network parameters are the most significant process signals for endpoint in low open area etch processes. The phase and error magnitude between the RF applied and the reflected RF power are most important. Unfortunately, these signals have a significant amount of noise and/or they do not show repeatable signals. For example, in some cases, an endpoint signal is observed in the phase data but not in the magnitude data. In other cases, an endpoint signal appears in the magnitude data but not in the phase data. The same can be said about the other signals (e.g., lower electrode temperature, dc bias). However, combining these signals and mapping as described herein yields higher reliability in determining an endpoint.

In order to overcome the low signal to noise ratio from some of the key process signals where the noise can be so high that the endpoint signal is never seen, one can use stochastic resonance (SR) to increase the signal to noise ratio. The SR technique is best suited to extracting background signals from a noisy environment and is best used to extract low frequency signals. In some cases, one could use an adjacent averaging technique for a low pass filter instead of stochastic resonance. If it is assumed that the observed noise is stochastic, one can add artificially generated random signals to a noisy process signal. The frequency of the noise added should be about the same as the frequency of the observed stochastic process affecting the main signal. Often after the addition, there is a threshold operation to further process the signal. If the new signal is above some threshold, the numerical value is set to one. If the new signal is below the threshold, it is allowed to stay at that value or set to zero. The two random signals will cancel each other out leaving the main signal behind.

Figure 25:
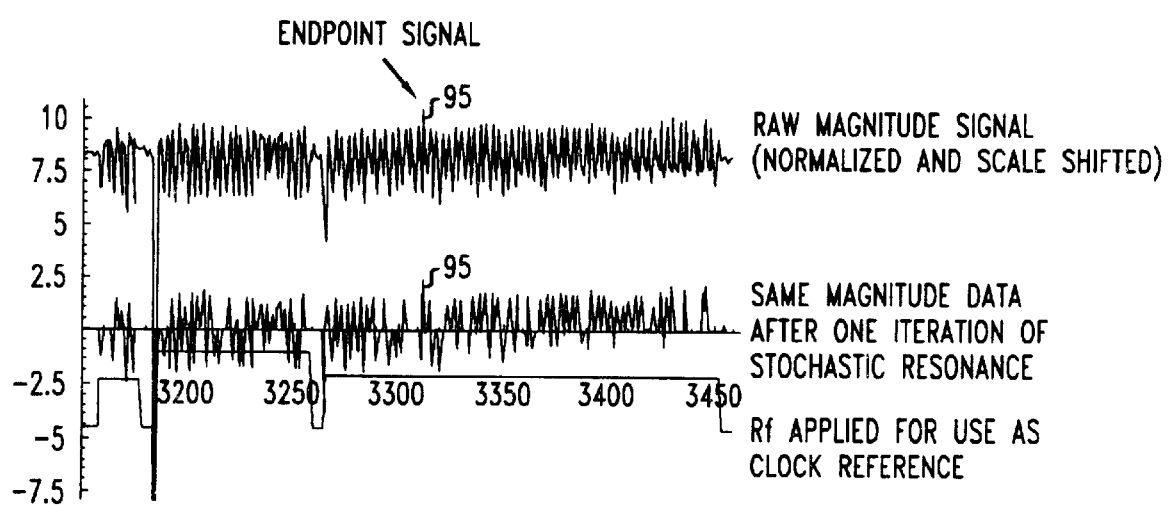
FIG. 25 shows raw and stochastic resonance modified error of magnitude data from the error between the applied RF power and the reflected power.

If the signal of interest is near the same frequency as the noise than the SR technique looses some of its strength. FIG. 25 shows an example of SR applied to a matching network magnitude data in which the data collection frequency is about 1 Hz and noise near the same frequency. The top trace is for the raw magnitude signal, the middle trace is for the SR processed signal, and the bottom trace is the applied RF power for reference as a clock signal. The endpoint signal is shown at 95. It is clear that the SR technique did improve the signal to noise ratio in the vicinity of the endpoint signal but that the signal is not as clear as was accomplished with the other methods of analysis described above.

Intuitively, one would expect to see some signal at the process endpoint as the impedance of the plasma-circuit (considering the plasma and the wafer as components in an electronic network) changes. The fact that the signal is weak and short duration is likely due to the speed of the matching network tuning the impedance. So, sometimes the magnitude will show an endpoint signal, and sometimes the phase or the electrode temperature will show a change. Seldom do all the process signals indicate an endpoint spike. But when these weak signals are combined using some $R^m \rightarrow R$ map, then one is able to see an endpoint. It is also possible that a faster data collection rate could provide improved results in detecting process endpoints.

Not all the methods are equally excellent in detecting a process endpoint. Some are clearly better than others, and one needs to experiment with the methods and the parameters to obtain the best results. The strength of the methods is that they combine m process signals (perhaps weak signals) into a scalar signal. It is believed that the SVD, the vector norm, angles in hyperspace, and Minkowski distance are the best-behaved methods and each of those methods have a solid mathematical foundation. The area of sums-of-polynomial and area of product-of-polynomial methods are, more-or-less, ad hoc but they enable one to tune the parameters by hand to obtain good performance. The sums-of-polynomial methods do preserve the means and variances across time for the individual vector elements but the computation of the area may yield near zero values for symmetric functions. Similarly, integrating the sums-of-Chebyshev and sums-of-Legendre polynomials from [−1,1] may produce huge numbers since some of the higher-order polynomials will diverge to almost infinity. These functions are better behaved in the region of [−0.7, 0.7]. This is even more strongly observed in the product-of-polynomials methods where the definite integral produces values differing by 12 orders of magnitude from method to method. It should be noted that some of the polynomials require use of even integer powers while others require use of odd integer powers. For example, in FIG. 7A, it can be seen that the odd integer powers are symmetric about the y-axis and therefore produce a null result. Thus, the Chebyshev polynomial would use only even integer powers. Further, it is believed that only integers should be used in the polynomials since non-integers may likely create null results.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed is:

1. A method for processing a sequence of sets of input data signals obtained from monitoring of a manufacturing process, each set of input data signals comprising $m \geq 2$ data signals, the method comprising:

applying each set of input data signals as coefficients of an orthogonal polynomial transfer function; and integrating within the defined limits of the polynomial transfer function for each data set to obtain a scalar value.

2. The method of claim 1 wherein the integer powers are even integers.

3. The method of claim 1 wherein the integer powers are odd integers.

4. The method of claim 1 wherein the method of integrating comprises piecewise integration of each term of the transfer function and summation of results of each piecewise integration.

5. The method of claim 1 and including the step of empirically selecting the integer powers to emphasize selected ones of the input data signals.

6. The method of claim 1 wherein the transfer function comprises a Fourier transform.

7. The method of claim 1 wherein the transfer function comprises a Chebyshev polynomial.

8. The method of claim 1 wherein the transfer function comprises a Legendre polynomial.

9. The method of claim 1 wherein the transfer fiction comprises an Andrews-Haar wavelet function.

10. A method according to claim 1 wherein each of said sets of input data signals reflects the state of an observed process.

11. A method according to claim 10 wherein each of said sets of input data signals comprise data signals $I_1, I_2, \ldots I_m$ that reflect real time observations of respective state variables of the observed process.

12. A method according to claim 10 wherein each of said sets of input data signals comprises data signals $I_1, I_2, \ldots I_m$ that reflects non-real time observations of the process.

13. The method of claim 10 wherein the observed process comprises a plasma etching process in an integrated circuit manufacturing process, each of the input data signals representing a measured characteristic of the etching process.

14. The method of claim 13 wherein each set of input data signals define the state of the etching process at a selected time.

15. The method of claim 14 wherein at least one of the input data signals exhibits a change at an endpoint of the etching process and the polynomial transfer function is selected to produce an amplitude spike in the integrated function concurrent with the endpoint.

16. The method of claim 15 wherein the input data signals are selected from the group comprising reflected RF power, dc bias, upper electrode temperature, lower electrode temperature, wall temperature, electrostatic chuck voltage, electrostatic chuck current, adaptive pressure control valve position, C1 capacitor position, C2 capacitor position, phase difference between RF applied and RF reflected and matching network error magnitude.

17. The method of claim 16 wherein the order of the coefficients corresponding to the selected input data signals is selected empirically to produce a maximum signal.

18. A method for determining endpoints in a semiconductor plasma etch process comprising the steps of:

obtaining in situ etch process data signals $I_1, I_2, \ldots I_m$ that are representative of real time observations of respective state variables of an observed plasma etch process and forming sets of data input signals based on the observed in situ etch process data signals $I_1, I_2, \ldots I_m$;

transforming each set of input data signals to a set of output data signals based on an orthogonal polynomial transform function, wherein the in situ process data signals $I_1, I_2, \ldots I_m$ are coefficients in evaluating the polynomial transform function thereby generating a sequence of sets of output data signals; and integrating the resulting polynomial transform function to determine an area as a function of time; and evaluating the determined area at selected time intervals to identify process endpoints.

19. A method according to claim 6 and further comprising the step of integrating between upper and lower limits.

20. A method according to claim 6 wherein the state variables represent intensity values selected from the group comprising reflected RF power, dc bias, upper electrode temperature, lower electrode temperature, wall temperature, electrostatic chuck voltage, electrostatic chuck current, adaptive pressure control valve position, C1 capacitor position, C2 capacitor position, phase difference between RF applied and RF reflected and matching network error magnitude.

21. A method for determining endpoints in a semiconductor etch process comprising the steps of:

obtaining in situ etch process data signals $I_1, I_2, \ldots I_m$ that are representative of real time observations of respective state variables of an observed plasma etch process and forming sets of data input signals based on the observed in situ etch process data signals $I_1, I_2, \ldots I_m$;

transforming each set of input data signals to a set of output data signals based on an orthogonal polynomial transform function wherein the in situ etch process data signals are used as coefficients in evaluating polynomial transform functions, thereby generating a sequence of sets of output data signals;

integrating the resulting polynomial transform function to determine a scalar as a function of time; and displaying a graph of scalar values as a function of time to determine a plasma etch endpoint in time.

22. A method according to claim 21 wherein the etch point is identified by a change in magnitude of the scalar values.

23. A system for processing a sequence of m-dimensional input data signals, $m \geq 2$, the system comprising:

a data processor for transforming each m-dimensional input data signal to a set of output data signals based on an orthogonal polynomial transform function, wherein the input data signals are used as coefficients in evaluating the polynomial transform functions, said data processor also integrating within the defined limits of the transform function to determine a scalar value as a function of time; and a display system for displaying a graph of the scalar values as a function of time.

24. A system according to claim 23 wherein the multi-dimensional input data signals each represent the state of a monitored process at a particular time, and the displayed graph represents a data visualization of the state of the monitored process at discrete times.

25. A system according to claim 23 wherein the multi-dimensional input data signals each comprise $I_1, I_2, \ldots I_m$ data signals that reflect real time observations of respective state variables of the observed process.

26. A system according to claim 25 wherein the state variables represent intensity values of measured variables selected from the group comprising optical emission spectrum wavelengths that are monitored in the plasma etching process, reflected RF power, dc bias, upper electrode temperature, lower electrode temperature, wall temperature, electrostatic chuck voltage, electrostatic chuck current, adaptive pressure control valve position, C1 capacitor position, C2 capacitor position, phase difference between RF applied and RF reflected and matching network error magnitude.

27. A system according to claim 23 wherein the transform function comprises an adaptive algorithm.

28. A system according to claim 27 wherein the adaptive algorithm weights the input data signals as a function of likelihood of indicating an endpoint.

* * * * *